US008207720B2

(12) United States Patent
Tang et al.

(10) Patent No.: US 8,207,720 B2
(45) Date of Patent: Jun. 26, 2012

(54) METHODS AND APPARATUS FOR POWER SUPPLY LOAD DUMP COMPENSATION

(75) Inventors: Benjamin Tang, Rancho Palos Verdes, CA (US); Tim M. Ng, Monterey Park, CA (US)

(73) Assignee: Infineon Technologies Austria AG, Villach (AT)

( * ) Notice: Subject to any disclaimer, the term of this patent is extended or adjusted under 35 U.S.C. 154(b) by 522 days.

(21) Appl. No.: 12/505,838

(22) Filed: Jul. 20, 2009

(65) Prior Publication Data

US 2010/0013452 A1   Jan. 21, 2010

Related U.S. Application Data

(60) Provisional application No. 61/082,049, filed on Jul. 18, 2008, provisional application No. 61/082,043, filed on Jul. 18, 2008.

(51) Int. Cl.
*G05F 1/59* (2006.01)
(52) U.S. Cl. ............... 323/271; 323/282; 323/901
(58) Field of Classification Search .......... 323/271, 323/282, 901
See application file for complete search history.

(56) References Cited

U.S. PATENT DOCUMENTS

| | | | |
|---|---|---|---|
| 5,627,460 A * | 5/1997 | Bazinet et al. ........... | 323/288 |
| 6,172,493 B1 * | 1/2001 | Grant ....................... | 323/288 |
| 6,437,549 B1 * | 8/2002 | Takagishi ................. | 323/282 |
| 6,812,782 B2 * | 11/2004 | Grant ....................... | 327/589 |
| 7,019,501 B2 * | 3/2006 | Dogome et al. ......... | 323/282 |
| 7,679,341 B2 * | 3/2010 | Chen ........................ | 323/224 |
| 7,808,222 B2 * | 10/2010 | Ueunten ................... | 323/271 |
| 2004/0036458 A1 * | 2/2004 | Johnson et al. .......... | 323/282 |
| 2004/0130307 A1 * | 7/2004 | Dequina et al. .......... | 323/282 |
| 2005/0057239 A1 * | 3/2005 | Fowler et al. ............ | 323/282 |
| 2005/0285585 A1 * | 12/2005 | Noma ....................... | 323/284 |
| 2006/0038547 A1 * | 2/2006 | Ahmad ..................... | 323/284 |
| 2006/0113979 A1 * | 6/2006 | Ishigaki et al. .......... | 323/282 |
| 2006/0273774 A1 * | 12/2006 | Galinski, III ............ | 323/288 |
| 2007/0024261 A1 * | 2/2007 | Wong et al. .............. | 323/288 |
| 2007/0046275 A1 * | 3/2007 | Shirai et al. ............. | 323/284 |
| 2007/0108952 A1 * | 5/2007 | Bartolo et al. ........... | 323/282 |
| 2007/0159150 A1 * | 7/2007 | Hosokawa et al. ...... | 323/285 |
| 2008/0218141 A1 * | 9/2008 | Lu et al. ................... | 323/282 |
| 2008/0224676 A1 * | 9/2008 | Kudo et al. .............. | 323/282 |
| 2008/0278135 A1 * | 11/2008 | De Lima Filho et al. | 323/288 |
| 2008/0303500 A1 * | 12/2008 | Hasegawa et al. ....... | 323/282 |
| 2009/0135632 A1 * | 5/2009 | Sohma .................... | 363/89 |
| 2010/0013452 A1 * | 1/2010 | Tang et al. ............... | 323/282 |
| 2010/0072967 A1 * | 3/2010 | Kamishinbara et al. | 323/284 |
| 2010/0156372 A1 * | 6/2010 | Kobayashi et al. ..... | 323/282 |
| 2010/0259238 A1 * | 10/2010 | Cheng .................... | 323/282 |
| 2010/0315055 A1 * | 12/2010 | Miyazaki ................ | 323/283 |
| 2011/0133711 A1 * | 6/2011 | Murakami et al. ...... | 323/282 |

(Continued)

*Primary Examiner* — Jeffrey Sterrett
(74) *Attorney, Agent, or Firm* — Murphy, Bilak & Homiller, PLLC

(57) ABSTRACT

Methods and apparatus for power supply load dump compensation according to various aspects of the present invention may operate in conjunction with a power stage system, such as a power stage system comprising a bootstrapped driver circuit and a power stage responsive to the driver circuit. The power stage system may further include a load dump compensation circuit connected to the driver circuit, wherein the load dump compensation circuit is configured to remove a bias current generated by the bootstrapped driver circuit. Various aspects of the present invention may be implemented in conjunction with any appropriate power supply, such as a switching regulator, for example a buck converter.

28 Claims, 4 Drawing Sheets

U.S. PATENT DOCUMENTS

2011/0193543 A1* 8/2011 Nguyen .......................... 323/285
2011/0298436 A1* 12/2011 Tang et al. ..................... 323/282
2012/0001608 A1* 1/2012 Sato et al. ..................... 323/282
2012/0013323 A1* 1/2012 Kenney ......................... 323/285

* cited by examiner

METHODS AND APPARATUS FOR POWER SUPPLY LOAD DUMP COMPENSATION

CROSS-REFERENCES TO RELATED APPLICATIONS

The present application claims the benefit of U.S. Provisional Patent Application Ser. No. 61/082,049, filed Jul. 18, 2008, entitled "Methods and Apparatus for Load Dump Compensation of Bootstrapped Gate Driver Bias Current in Switching Regulators", and U.S. Provisional Patent Application Ser. No. 61/082,043, filed Jul. 18, 2008, entitled "Methods and Apparatus for Load Dump Compensation of Bootstrapped Gate Driver Bias Current in Switching Regulators", and incorporates these applications by reference.

BACKGROUND OF THE INVENTION

Switching power supplies are popular for high power applications because of their high efficiency and the small amount of area/volume they require. Popular switching supply topologies include buck, boost, buck-boost, forward, flyback, half-bridge, full-bridge, and SEPIC topologies. Buck converters are particularly well suited for providing the high current at low voltages needed by today's high performance integrated circuits such as microprocessors, graphics processors, and network processors. Buck converters are typically implemented with active components such as a pulse width modulation controller IC (PWM), driver, power MOSFETs, and passive components such as inductors, transformers or coupled inductors, capacitors, and resistors.

The active components may be integrated, partially integrated (e.g., just the drivers and MOSFETs), or discrete. For today's highest current applications, the active components are typically discrete due to the difficulty in thermal and electrical design of a fully integrated stage. However, the capability or integrated power supply stages has begun to approach and may surpass the capability of discrete components, as more advanced and specialized semiconductor processes are developed for this type of application.

SUMMARY OF THE INVENTION

Methods and apparatus for power supply load dump compensation according to various aspects of the present invention may operate in conjunction with a power stage system, such as a power stage system comprising a bootstrapped driver circuit and a power stage responsive to the driver circuit. The power stage system may further include a load dump compensation circuit connected to the driver circuit, wherein the load dump compensation circuit is configured to remove a bias current generated by the bootstrapped driver circuit. Various aspects of the present invention may be implemented in conjunction with any appropriate power supply, such as a switching regulator, for example a buck converter.

BRIEF DESCRIPTION OF THE DRAWING FIGURES

A more complete understanding of the present invention may be derived by referring to the detailed description and claims when considered in connection with the following illustrative figures. In the following figures, like reference numbers refer to similar elements and steps throughout the figures.

Figure 6A:
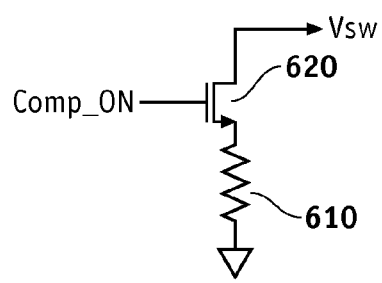
Figure 6B:
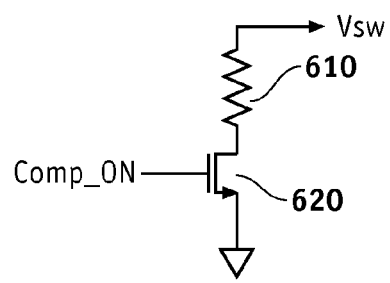

FIGS. 6A-B illustrate a load dump compensation circuit comprising a dump resistor.

Figure 7A:
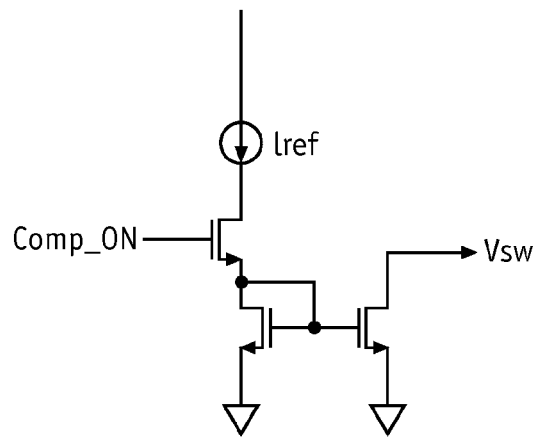
Figure 7B:
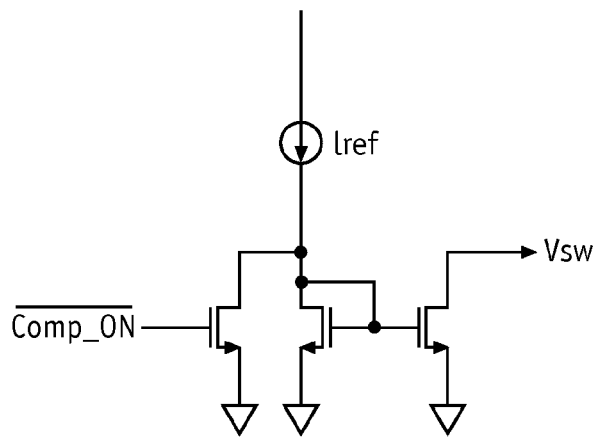
Figure 7C:
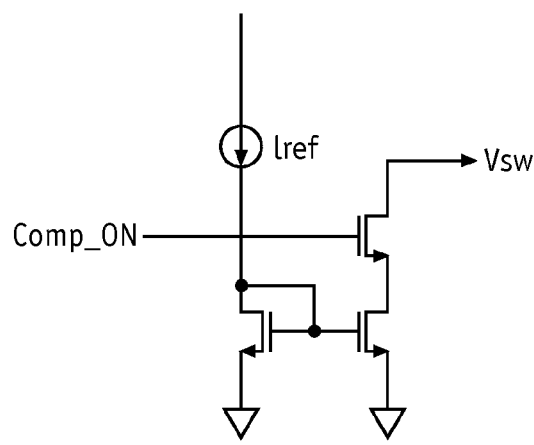

FIGS. 7A-C illustrate a compensation control circuit comprising a current mirror.

DETAILED DESCRIPTION OF EXEMPLARY EMBODIMENTS

Various aspects of the present invention may be described in terms of functional block components and various processing steps. Such functional blocks and steps may be realized by any number of hardware or software components configured to perform the specified functions and achieve the various results. For example, systems and methods according to various aspects of the present invention may employ integrated components and electronic devices that may be implemented in any appropriate manner, such as integrated circuits, logic arrays, processors, transistors, resistors, capacitors, inductors, and the like. In addition, various aspects of the present invention may be practiced in conjunction with any suitable converter and/or regulator applications, and the systems described are merely exemplary applications for the invention. Further, various aspects of the present invention may employ any number of conventional techniques for regulating power, modifying a waveform, driving a voltage switch, controlling a driver, filtering a signal, and the like.

Various representative implementations of the present invention may be implemented in conjunction with a power supply. The power supply may comprise, for example, a converter using step-down, step-up, buck, boost, buck-boost, forward, flyback, half-bridge, full-bridge, and/or SEPIC topologies. For example, referring to FIG. 1, a power supply according to various aspects of the present invention may comprise a switching regulator 100, such as a buck converter. A buck converter may step down a DC voltage to a lower DC voltage. Generally, the buck converter may generate a switching waveform or square wave that is filtered to provide a relatively smooth output, which allows the output voltage to be regulated by controlling the duty cycle of the waveform. Because the power stage is fully switched (i.e. the power MOSFET is fully off or on), there is little loss in the power stage and the converter efficiency is very high. While the exemplary embodiment is discussed in conjunction with a buck converter, various aspects of the present invention may be practiced in conjunction with other switching regulator topologies.

Figure 1:
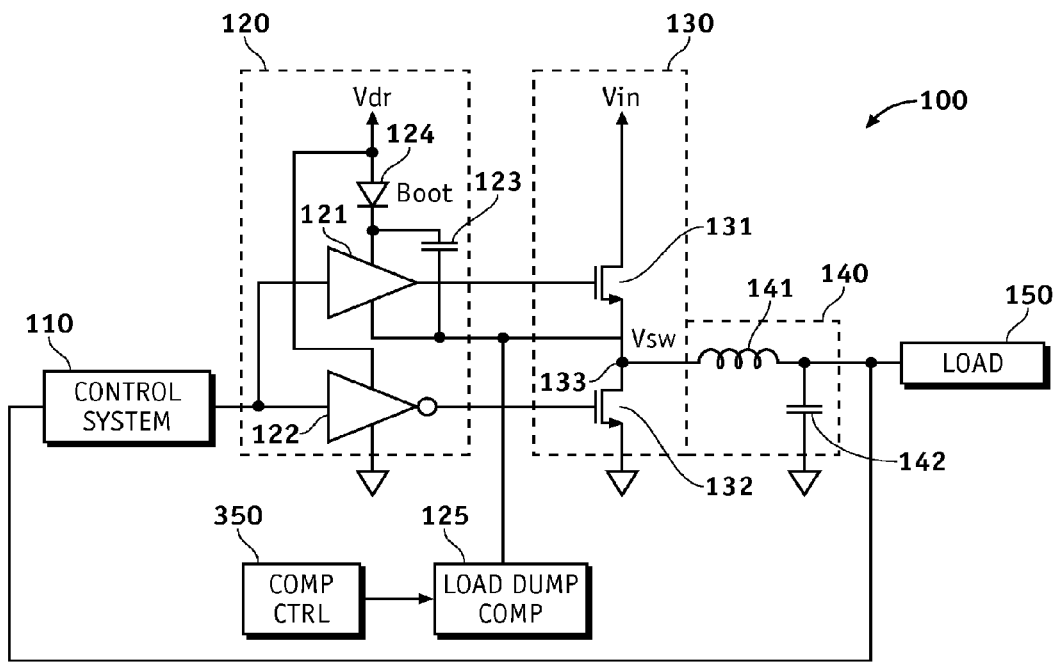
FIG. 1 is a schematic of a power supply according to various aspects of the present invention.

In the exemplary embodiment of FIG. 1, the buck converter comprises a bootstrapped buck converter comprising a control system 110, a driver circuit 120, a power stage 130, and a filter 140. Generally, the control system 110 provides a control signal to the driver circuit 120 to control the output of the power stage 130. The driver circuit 120 responds to the control signal and drives the power stage 130 to maintain, increase, or decrease the output voltage and/or current provided to a load 150. The filter 140 smoothes the output signal to supply a relatively level output voltage, for example via an output inductor 141 (also called a buck inductor) and output capacitor 142 (also called a decoupling capacitor). In various embodiments, the regulator 100 includes an integrated power stage system including the power stage 130 and, in some embodiments, the driver circuit 120. The regulator 100 may further comprise a load dump compensation circuit 125 configured to dump bias current generated by a bootstrap circuit to inhibit transfer of the bias current to the output and thus to the load 150.

The control system 110 may comprise any suitable system for controlling the output voltage. In the present embodiment, the control system 110 comprises a pulse width modulator (PWM), such as a conventional PWM providing a pulse width modulated signal to the driver circuit 120. The control system 110 may operate in conjunction with one or more feedback signals or feedforward designs. In the present exemplary embodiment, the control system senses the output voltage at the load 150 and adjusts the control signals to either increase or decrease the duty cycle. Adjusting the duty cycle changes the output voltage to approach a desired target voltage.

The driver circuit 120 drives the power stage 130 according to signals from the control system 110. The driver circuit 120 may comprise any suitable system for controlling the power stage 130 in response to the control system 110. For example, the driver circuit 120 may comprise one or more gate driver ICs 121, 122 or other suitable elements for relaying signals to electrical switches, such as power transistors in the power stage 130. In the present embodiment, the gate driver ICs 121, 122 comprise power amplifiers that produce the high current required to drive large capacitive loads, such as the gates of power MOSFETs. The driver circuit 121, 122 may be implemented, however, with any appropriate components or systems.

The power stage 130 supplies power to the load 150 via the filter 140 according to signals from the driver circuit 120. The control system 110 drives the output of the power stage 130 via the driver circuit 120, and the output of the power stage 130 is connected to the filter 140. The power stage 130 may comprise any suitable system for delivering power to the load in response to signals from the control system 110 and/or the driver circuit 120. In the present embodiment, the power stage 130 comprises one or more switches 131, 132, such as power FETs. For example, the power stage 130 may comprise N-channel MOSFETs for superior conductivity compared to P-channel MOSFETs and lower RDSon or gate charge Qg for comparable devices.

In the present embodiment, the switches 131, 132 are coupled in series between an input voltage $V_{in}$ and ground, and each switch 131, 132 has a control input receiving a signal from the driver circuit 120. For example, the power stage 130 may comprise a conventional control FET comprising a MOSFET connecting the input supply to the output inductor 141 and a conventional synchronous FET comprising a MOSFET connecting a ground reference to the output inductor 141. The power stage 130 may be implemented, however, in any suitable manner. For example, a diode may be used instead of a synchronous FET, though in high power buck converters, the voltage drop across the diode during conduction may dissipate a significant amount of power.

N-channel MOSFETs may require the gate to be driven to a higher voltage than the source to activate the device. The control MOSFET gate voltage level may be set relative to its source. Node 133 may be referred to as the swing node, in reference to the node voltage swinging from ground to the input voltage. The gate voltage may track these transitions for proper operation. The driver circuit 120 may comprise a bootstrapped driver circuit, or be connected to a bootstrap circuit, to provide extra voltage to activate the control MOSFET of the switch 131. The bootstrap circuit may comprise any suitable bootstrap circuit to provide the extra voltage, such as a circuit comprising a negative terminal tied to the swing node and a positive terminal at a substantially fixed potential relative to the swing node. For example, the bootstrap circuit may comprise an external capacitor 123 connected across the driver input voltage and the swing node. The bootstrap circuit may also include a diode 124. The diode 124 allows the capacitor 123 to charge to the bootstrap voltage when the control MOSFET of the switch 131 is turned off. When the control MOSFET of the switch 131 is turned on, the bootstrap voltage is added to the switching voltage, providing the extra voltage to drive the gate above switching voltage.

Figure 2:
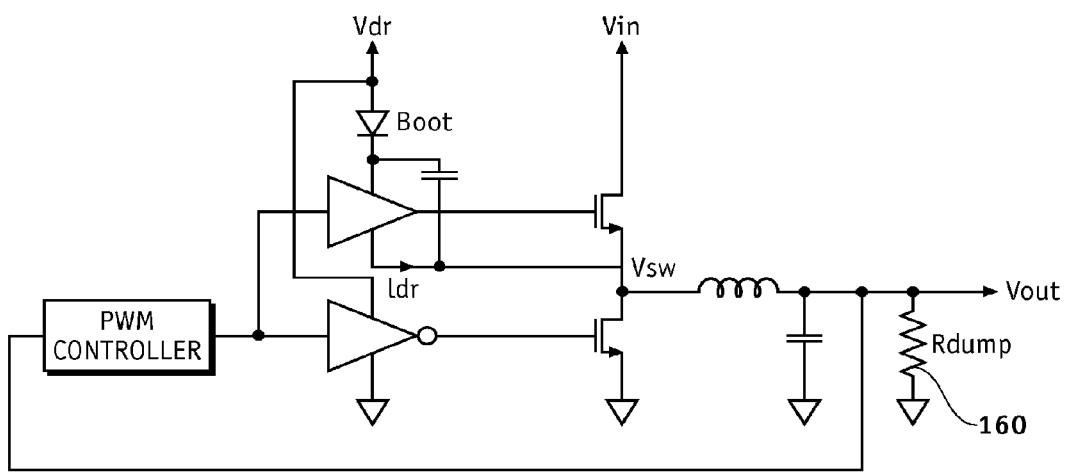
FIG. 2 is a schematic of a buck converter including a dump resistor connected to the load.

Referring to FIG. 2, the bootstrap circuit may generate a bias current Idr flowing to the swing node Vsw. Without a return path to ground, the bias current flows through the output node and into the load 150, which may cause the output voltage to drift higher. The higher voltage may result in an overvoltage condition or a partial biasing of the output voltage at a level higher than 0V, but lower than the operating voltage, which may be referred to as a load dump situation. In some systems, a dump resistor 160 may be connected between the output node and ground to ensure that the load 150 can sink a small amount of current without causing an overvoltage condition. A dump resistor, however, may reduce efficiency, generate heat, require an additional component, and add to power loss.

The regulator 100 may comprise the load dump compensation circuit 125 to dump the bias current from the bootstrap circuit to inhibit transfer of the bias current to the load 150 node. For example, the load dump compensation circuit 125 may comprise a circuit for transferring current to ground before transmission by the filter 140 to the load 150 node. Referring again to FIG. 1, in one embodiment, the load dump compensation circuit 125 is connected to the bootstrap capacitor 123 at the swing node Vsw 133. The load dump compensation circuit 125 may be connected in any appropriate manner, however, to transfer the bias current away from the load 150. In addition, the load dump compensation circuit 125 may be switchable such that the load dump compensation circuit 125 may be enabled and disabled. When enabled, the load dump compensation circuit 125 may transfer at least a portion of the bias current away from the load 150. When disabled, the load dump compensation circuit 125 cannot transfer the bias current away from the load 150.

The load dump compensation circuit 125 may comprise any appropriate circuit to transfer the bias current away from the load 150, such as a resistor, diode, switch, current source, and/or current sink. For example, referring to FIG. 3, the load dump compensation circuit 125 may comprise a current sink 270. The current sink 270 may be connected between the swing node Vsw 133 to sink the bias current Idr to ground, which inhibits the output voltage from drifting up, such as when a no load or light load condition is present on Vout. The current draw induced by the current sink 270 may act as an additional load current supplied by the power stage 130.

Referring again to FIG. 1, the regulator 100 may comprise a compensation control circuit 380 to enable and/or disable the load dump compensation circuit 125. The compensation control circuit 380 may comprise any appropriate system for enabling and disabling the load dump compensation circuit 125. In addition, the compensation control circuit 380 may enable and disable the load dump compensation circuit 125 according to any suitable criteria and/or signals. For example, the compensation control circuit 380 may respond to an enable signal to enable and/or disable the load dump compensation circuit 125, the driver circuit 120, the power stage 130, and/or other relevant system. The compensation control circuit 380 may also or alternatively respond to signals from the control system 110, such as the PWM signal from the PWM.

Figure 4:
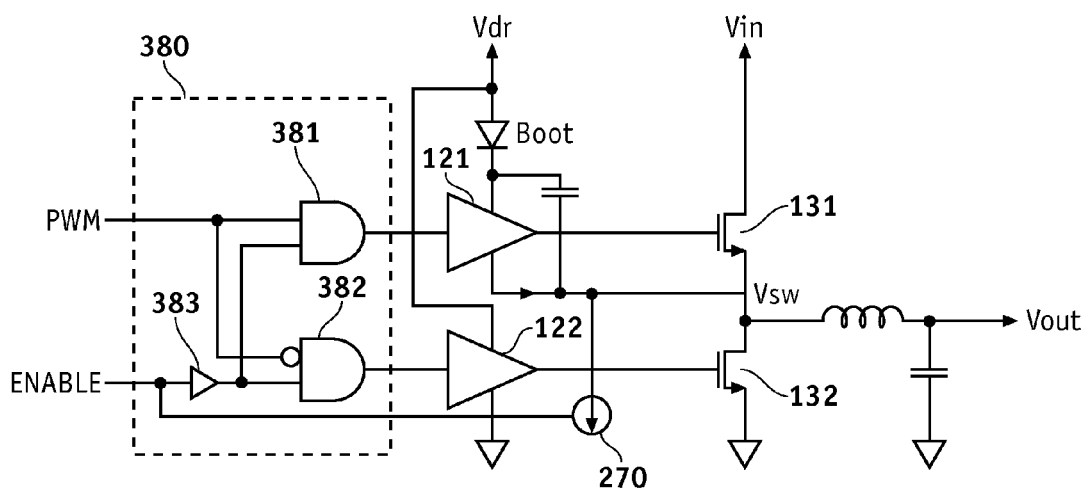
FIG. 4 is a schematic of a buck converter including a compensation control circuit with two inputs.

For example, referring to FIG. 4, the compensation control circuit 380 may enable and disable the load dump compensation circuit 125 in response to an ENABLE signal. In the present embodiment, assertion of the ENABLE signal disables the driver circuit 120 and enables the load dump compensation circuit 125. Conversely, deactivation of the ENABLE signal enables the driver circuit 120 and disables the load dump compensation circuit 125. As a result, the load dump compensation circuit 125 is gated so that it only operates when a load dump situation occurs, such as when the driver circuit 120 and/or the power stage 130 are inactive, for example when neither of the FETs in the power stage 130 is conducting. When the driver circuit 120 and the power stage 130 are active, load dump compensation may be deactivated because the load or the low side FET 132 may sink the bias current to ground.

In the present exemplary embodiment, the compensation control circuit 380 includes dual inputs to control the driver circuit 120 and the load dump compensation circuit 125. The first input is coupled to the control system 110 and the second input receives the ENABLE signal. The ENABLE signal may be generated by any suitable system, including circuitry integrated into the control system 110, by the active transient response of the regulator 100, by an external transient response circuit, or by a sense circuit.

In the present embodiment, the compensation control circuit 380 comprises two AND-gates 381, 382 and an inverter 383. The first AND-gate 381 controls the operation of control FET 131. The inputs of the first AND-gate 381 are coupled to the PWM and to the inverter 383, which inverts the ENABLE signal. The output of the first AND-gate 381 is coupled to the gate driver 121, which in turn drives the control FET 131. The second AND-gate 382 controls the operation of the synchronous FET 132. One input of the second AND-gate 382 is coupled to the inverter 383, and an inverting input 384 is connected to the PWM. The output is coupled to the gate driver 122, which in turn drives the synchronous FET 132. This combination of logic dictates that the PWM controls output normally when the ENABLE signal is low and the load dump compensation circuit 125 is disabled. When the ENABLE signal is high, the driver circuit 120 and the power stage 130 are disabled and the load dump compensation circuit 125 is enabled.

Figure 5:
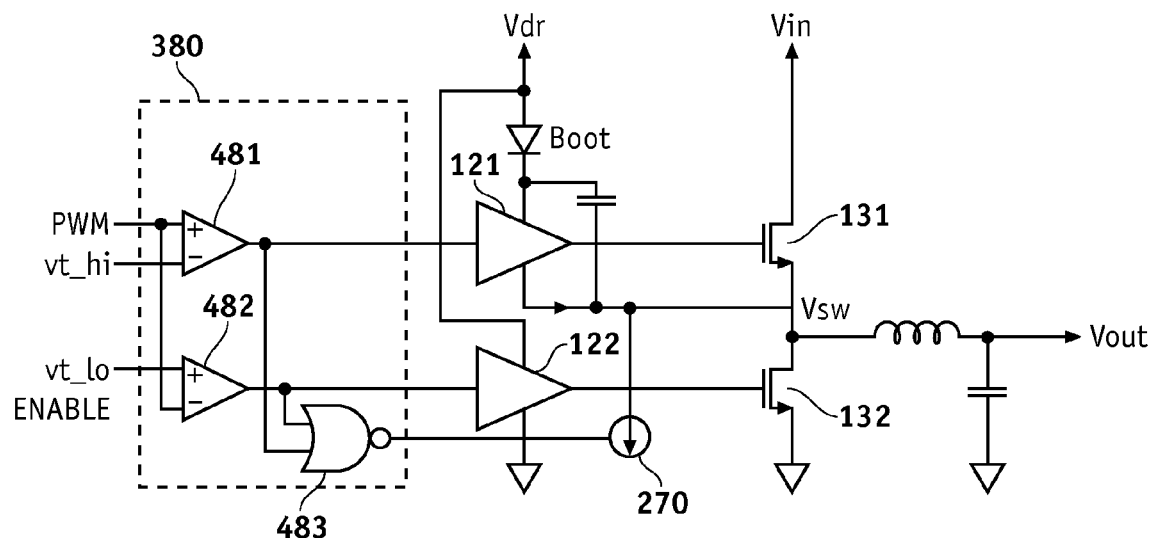
FIG. 5 is a schematic of a buck converter including a compensation control circuit with trivalent inputs.

The compensation control circuit 380 may be configured to operate according to any appropriate criteria. For example, the compensation control circuit 380 may enable the load dump compensation circuit 125 when neither of the power stage FETs 131, 132 is enabled. Referring to FIG. 5, the compensation control circuit 380 may operate in conjunction with trivalent inputs. In this embodiment, the compensation control circuit 380 may comprise a first input connected to the control system 110, a second input connected to a high threshold voltage vt_hi, and a third input connected to a low threshold voltage vt_low. The trivalent inputs allow for three states to be defined: a low state which activates the synchronous FET 132, a high state which activates the control FET 131, and a middle state in which the power stage 130 is disabled and the load dump compensation circuit 125 is enabled.

The present compensation control circuit 380 comprises two comparators 481, 482 and a NOR-gate 483. The first comparator 481 controls the control FET 131 and includes a first input coupled to the PWM 110 and second input coupled to the high state threshold voltage vt_hi. The output of comparator 481 is coupled to the control FET's 131 gate driver 121 and NOR-gate 483. The second comparator 482 controls the synchronous FET 132 and includes a first input coupled to the low state threshold voltage vt_low and a second input coupled to PWM 110. The output of comparator 482 is coupled to the synchronous FET's 132 gate driver 122 and NOR-gate 483. The output of NOR-gate 483 is coupled to the enabling input of the load dump compensation circuit 125. The compensation control circuit 380 in this configuration allows the load dump compensation circuit 125 to become active only during the middle state, i.e., when both power stage FETs 131, 132 are off.

The compensation control circuit 380 may control the load dump compensation circuit 125 in any appropriate manner. For example, the compensation control circuit 380 may include one or more switches to enable and disable the load dump compensation circuit 125. The compensation control circuit 380 may be implemented in any suitable manner, however, to control the load dump compensation circuit 125.

For example, referring to FIGS. 6A-B, the load dump compensation circuit 125 may comprise a resistor 610 connected in series the swing node Vsw. The compensation control circuit 380 may comprise a switch 620, such as a conventional FET, connected in series with the resistor. In the present embodiments, the resistor 610 may be inserted either in the source or the drain of the gating FET of the switch 620. The switch 620 may be responsive to a compensation control signal COMP_ON that enables and disables the load dump compensation circuit 125, such as a signal generated by the logic circuits described in conjunction with FIGS. 4 and 5. The gated resistor circuit may be controlled such that the resistor circuit is enabled only when the driver circuit 120 and/or the power stage 130 are deactivated. When enabled, the resistor 610 sinks current in proportion to the output voltage. The resistor 610 may comprise any appropriate resistive load or element, and may be scaled to optimize the range of operation.

Figure 3:
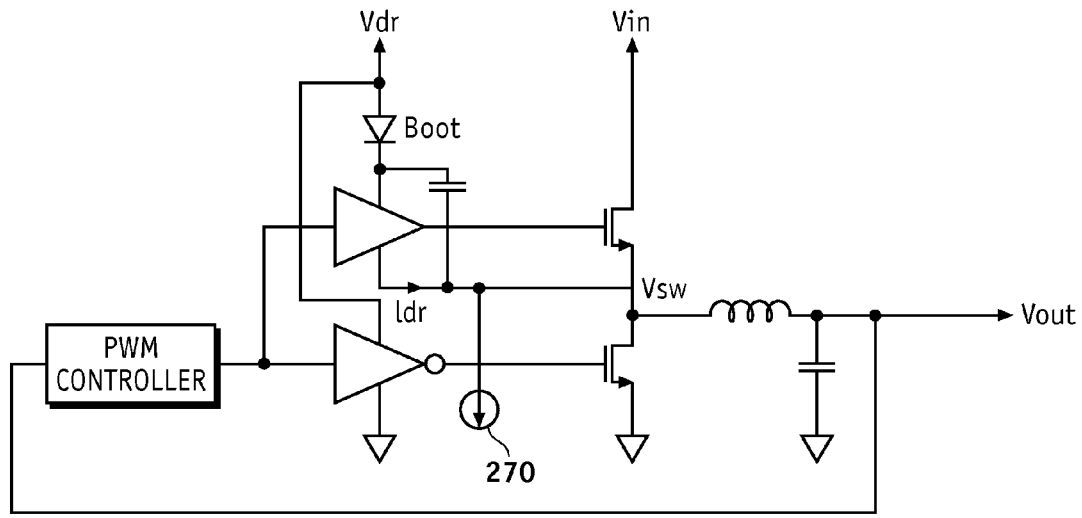
FIG. 3 is a schematic of a buck converter with a load dump compensation circuit comprising a current sink.

In another embodiment, the compensation control circuit 380 may be configured to control a load dump compensation circuit 125 including a current sink, such as the current sink of FIG. 3. For example, referring to FIGS. 7A-C, the compensation control circuit 380 may comprise a current mirror circuit. In various embodiments, the current mirror circuit may be connected in series with the current sink (FIG. 7A), in series with output current (FIG. 7C), or shunting the mirror gate voltage (FIG. 7B). The gated current mirror circuit may be controlled, such as in response to the compensation control signal, such that the current mirror circuit is enabled only when the driver circuit 120 and/or the power stage 130 are deactivated. When enabled, the current mirror sinks current up to its maximum current, or reduces output voltage to its voltage compliance level such that the compensation current matches the current being sourced into the Vsw node. The current mirror may be scaled to optimize the range of operation.

In the foregoing description, the invention has been described with reference to specific exemplary embodiments. Various modifications and changes may be made, however, without departing from the scope of the present invention as set forth. The description and figures are to be regarded in an illustrative manner rather than a restrictive one, and all such modifications and changes are intended to be included within the scope of the present invention. Accordingly, the scope of the invention should be determined by the generic embodiments described and their legal equivalents rather than by merely the specific examples described above. For example, the steps recited in any method or process embodiment may be executed in any appropriate order and are not limited to the explicit order presented in the specific examples. Additionally, the components and/or elements recited in any system embodiment may be combined in a variety of permutations to produce substantially the same result as the present invention and are accordingly not limited to the specific configuration recited in the specific examples.

Benefits other advantages, and solutions to problems have been described above with regard to particular embodiments. Any benefit, advantage, solution to problems, or any element that may cause any particular benefit, advantage, or solution to occur or to become more pronounced, however, is not to be construed as a critical, required, or essential feature or component.

The terms "comprises", "comprising", or any variation thereof, are intended to reference a non-exclusive inclusion, such that a process, method, article, composition, or apparatus that comprises a list of elements does not include only those elements recited, but may also include other elements not expressly listed or inherent to such process, method, article, composition, or apparatus. Other combinations and/or modifications of the above-described structures, arrangements, applications, proportions, elements, materials, or components used in the practice of the present invention, in addition to those not specifically recited, may be varied or otherwise particularly adapted to specific environments, manufacturing specifications, design parameters, or other operating requirements without departing from the general principles of the same.

The invention claimed is:

1. A power stage system, comprising:
   a bootstrapped driver circuit;
   a power stage responsive to the driver circuit; and
   a load dump compensation circuit connected to the driver circuit, wherein the load dump compensation circuit is configured to remove a bias current generated by the bootstrapped driver circuit.

2. A power stage system according to claim 1, wherein the load dump compensation circuit is switchable.

3. A power stage system according to claim 2, wherein the load dump compensation circuit is active only when the power stage is inactive.

4. A power stage system according to claim 2, wherein the load dump compensation circuit is active in response to an enable signal.

5. A power stage system according to claim 2, wherein the load dump compensation circuit is active to according to an enable signal and at least two voltage threshold levels.

6. A power stage system according to claim 1, further comprising a current mirror circuit coupled to the load dump compensation circuit, wherein the current mirror circuit is adapted to enable the load dump compensation circuit only when the power stage is inactive.

7. A power stage system according to claim 1, wherein the load dump compensation circuit comprises a resistor, and further comprising a compensation control circuit configured to selectively enable the load dump compensation circuit only when the power stage is inactive.

8. A power stage system according to claim 1, wherein the load dump compensation circuit comprises a current sink.

9. A switching regulator comprising the power stage system of claim 1.

10. A buck converter comprising the power stage system of claim 1.

11. An integrated power stage system for a power supply to be connected to a load, comprising:
    a power stage, comprising:
       a high side FET; and
       a low side FET, wherein the high side FET and the low side FET are coupled in series between a first potential and a second potential;
    a driver circuit, comprising:
       a high side driver configured to drive the high side FET;
       a low side driver configured to drive the low side FET; and
       a bootstrap circuit connected to the high side driver, wherein the bootstrap circuit is configured to provide a bias current to a node between the high side FET and the low side FET; and
    a load compensation circuit connected to the bootstrap circuit and configured to transfer the bias current away from the load.

12. An integrated power stage system according to claim 11, further comprising a compensation control circuit configured to selectively enable and disable the load dump compensation circuit.

13. An integrated power stage system according to claim 12, wherein the compensation control circuit is adapted to enable the load dump compensation circuit only when the power stage is inactive.

14. An integrated power stage system according to claim 12, wherein the compensation control circuit is adapted to enable the load dump compensation circuit in response to an enable signal.

15. An integrated power stage system according to claim 12, wherein the compensation control circuit is adapted to enable the load dump compensation circuit according to an enable signal and at least two voltage threshold levels.

16. An integrated power stage system according to claim 11, wherein the compensation control circuit comprises a current mirror circuit.

17. An integrated power stage system according to claim 16, wherein the current mirror circuit enables the load dump compensation circuit only when the power stage is inactive.

18. An integrated power stage system according to claim 11, wherein the load dump compensation circuit comprises a resistor, and further comprising a compensation control circuit configured to selectively enable the load dump compensation circuit only when the power stage is inactive.

19. An integrated power stage system according to claim 11, wherein the load dump compensation circuit comprises a current sink.

20. A switching regulator comprising the integrated power stage system of claim 11.

21. A buck converter comprising the integrated power stage system of claim 11.

22. A method for supplying power to a load, comprising:
    providing a driver circuit having a bootstrap circuit;
    providing a power stage responsive to the driver circuit; and
    providing a load dump compensation circuit connected to the driver circuit, wherein the load dump compensation circuit is configured to remove a bias current generated by the bootstrapped driver circuit.

23. A method for supplying power to a load according to claim 22, comprising:
    charging the bootstrap circuit for the driver circuit, wherein:
       the driver circuit drives the power stage, wherein the power stage is connected to the load through a filter; and
       the bootstrap circuit generates the bias current; and
    diverting the bias current away from the filter.

24. A method for supplying power to a load according to claim 23, wherein diverting the bias current comprises selectively enabling a load dump compensation circuit connected to the bootstrap circuit and a ground potential.

25. A method for supplying power to a load according to claim 24, wherein selectively enabling the load dump compensation circuit comprises selectively enabling the load dump compensation circuit according to an enable signal.

26. A method for supplying power to a load according to claim 24, wherein selectively enabling the load dump compensation circuit comprises selectively enabling the load dump compensation circuit according to an enable signal and at least two voltage threshold levels.

27. A method for supplying power to a load according to claim 23, wherein diverting the bias current comprises diverting the bias current from the bootstrap circuit to ground through a load dump compensation circuit.

28. A method for supplying power to a load according to claim 23, wherein diverting the bias current comprises diverting the bias current only when the power stage is inactive.

* * * * *